United States Patent
Jennings et al.

(10) Patent No.: US 8,288,683 B2
(45) Date of Patent: Oct. 16, 2012

(54) FAST AXIS BEAM PROFILE SHAPING FOR HIGH POWER LASER DIODE BASED ANNEALING SYSTEM

(75) Inventors: Dean Jennings, Beverly, MA (US); Abhilash J. Mayur, Salinas, CA (US); Timothy N. Thomas, Portland, OR (US); Vijay Parihar, Fremont, CA (US); Vedapuram S. Achutharaman, San Jose, CA (US); Randhir P. S. Thakur, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 904 days.

(21) Appl. No.: 12/291,002

(22) Filed: Nov. 4, 2008

(65) Prior Publication Data

US 2009/0152247 A1    Jun. 18, 2009

Related U.S. Application Data

(63) Continuation of application No. 11/508,781, filed on Aug. 23, 2006, now Pat. No. 7,674,999.

(51) Int. Cl.
  *B23K 26/00* (2006.01)
(52) U.S. Cl. ............ 219/121.76; 117/204; 117/904
(58) Field of Classification Search ............ 219/121.65, 219/121.66, 121.76, 121.85; 117/204, 904; 438/795
See application file for complete search history.

(56) References Cited

U.S. PATENT DOCUMENTS

| | | | |
|---|---|---|---|
| 3,778,791 A | 12/1973 | Lewicki et al. | 179/100.2 |
| 4,099,875 A | 7/1978 | McMahon et al. | 356/342 |
| 4,305,640 A | 12/1981 | Cullis et al. | 350/96.1 |
| 4,403,318 A | 9/1983 | Nagashima et al. | 369/100 |
| 4,647,774 A | 3/1987 | Brisk et al. | 250/338 |
| 4,710,911 A | 12/1987 | Yamada et al. | 369/100 |
| 4,730,113 A | 3/1988 | Edwards | 250/347 |
| 5,369,659 A | 11/1994 | Furumoto et al. | 372/50.23 |
| 5,463,202 A | 10/1995 | Kurosawa et al. | 219/121.83 |

(Continued)

FOREIGN PATENT DOCUMENTS

DE         10339237 A1      3/2004

(Continued)

OTHER PUBLICATIONS

U.S. Appl. No. 11/508,781, filed Aug. 23, 2006, Jennings et al.

(Continued)

*Primary Examiner* — Samuel M Heinrich

(74) *Attorney, Agent, or Firm* — Robert M. Wallace

(57) ABSTRACT

A dynamic surface anneal apparatus for annealing a semiconductor workpiece has a workpiece support for supporting a workpiece, an optical source and scanning apparatus for scanning the optical source and the workpiece support relative to one another along a fast axis. The optical source includes an array of laser emitters arranged generally in successive rows of the emitters, the rows being transverse to the fast axis. Plural collimating lenslets overlie respective ones of the rows of emitters and provide collimation along the fast axis. The selected lenslets have one or a succession of optical deflection angles corresponding to beam deflections along the fast axis for respective rows of emitters. Optics focus light from the array of laser emitters onto a surface of the workpiece to form a succession of line beams transverse to the fast axis spaced along the fast axis in accordance with the succession of deflection angles.

24 Claims, 13 Drawing Sheets

U.S. PATENT DOCUMENTS

| | | | |
|---|---|---|---|
| 5,861,992 A | 1/1999 | Gelbart | 359/619 |
| 6,044,096 A | 3/2000 | Wolak et al. | 372/36 |
| 6,080,236 A | 6/2000 | McCulloch et al. | 117/4 |
| 6,240,116 B1 | 5/2001 | Lang et al. | 372/50 |
| 6,400,513 B1 | 6/2002 | Southwell | 359/641 |
| 6,407,849 B1 | 6/2002 | Steinblatt | 359/290 |
| 6,407,870 B1 | 6/2002 | Hurevich et al. | 359/668 |
| 6,494,371 B1 | 12/2002 | Rekow et al. | 235/454 |
| 6,530,687 B1 | 3/2003 | Suzuki et al. | 374/131 |
| 6,531,681 B1 | 3/2003 | Markle et al. | 219/121.69 |
| 6,556,352 B2 | 4/2003 | Wang et al. | 359/641 |
| 6,717,105 B1 * | 4/2004 | Okamoto et al. | 219/121.76 |
| 6,747,245 B2 | 6/2004 | Talwar et al. | 219/121.8 |
| 6,771,686 B1 | 8/2004 | Ullman et al. | 372/92 |
| 6,780,692 B2 | 8/2004 | Tatsuki et al. | 438/166 |
| 6,809,012 B2 | 10/2004 | Yamazaki et al. | 438/473 |
| 6,895,164 B2 | 5/2005 | Saccomanno | 385/146 |
| 6,987,240 B2 | 1/2006 | Jennings et al. | 219/121.8 |
| 7,005,601 B2 | 2/2006 | Jennings | 219/121.66 |
| 7,097,709 B2 * | 8/2006 | Okamoto et al. | 117/201 |
| 7,112,760 B2 | 9/2006 | Ishikawa et al. | 219/121.76 |
| 7,129,440 B2 | 10/2006 | Adams et al. | 219/121.65 |
| 7,135,392 B1 | 11/2006 | Adams et al. | 438/166 |
| 7,250,618 B2 | 7/2007 | Sogard et al. | 250/492.24 |
| 7,317,179 B2 | 1/2008 | Akins et al. | 250/201.1 |
| 7,538,948 B2 | 5/2009 | Muenz et al. | 359/618 |
| 2003/0196996 A1 | 10/2003 | Jennings et al. | 219/121.73 |
| 2004/0095983 A1 | 5/2004 | Whitley | 372/108 |
| 2004/0149217 A1 | 8/2004 | Collins et al. | 118/723 |
| 2004/0179807 A1 | 9/2004 | Tanaka | 385/146 |
| 2004/0188399 A1 | 9/2004 | Smart | 219/121.69 |
| 2004/0198028 A1 | 10/2004 | Tanaka et al. | 438/487 |
| 2004/0263986 A1 | 12/2004 | Brown | 359/626 |
| 2005/0175285 A1 | 8/2005 | Reynolds et al. | 385/39 |
| 2006/0008237 A1 | 1/2006 | Imade | 385/146 |
| 2006/0102607 A1 | 5/2006 | Adams et al. | 374/126 |
| 2006/0105585 A1 | 5/2006 | Jennings et al. | 438/473 |
| 2006/0262408 A1 | 11/2006 | Kato | 359/618 |
| 2008/0210671 A1 | 9/2008 | Jennings et al. | 219/121.61 |

FOREIGN PATENT DOCUMENTS

| | | |
|---|---|---|
| EP | 0 231 794 A2 | 8/1987 |
| JP | 57099747 A | 6/1982 |
| JP | 200191231 A | 3/2000 |
| WO | WO 03/089184 | 10/2003 |
| WO | WO 2004/044955 | 5/2004 |

OTHER PUBLICATIONS

U.S. Appl. No. 11/508,376, filed Aug. 23, 2006, Jennings et al.
Official Action Dated Oct. 16, 2009 in Co-pending U.S. Appl. No. 11/508,781.

* cited by examiner

FAST AXIS BEAM PROFILE SHAPING FOR HIGH POWER LASER DIODE BASED ANNEALING SYSTEM

CROSS REFERENCE TO RELATED APPLICATIONS

This application is a continuation of U.S. application Ser. No. 11/508,781, filed Aug. 23, 2006 now U.S. Pat. No. 7,674,999 entitled FAST AXIS BEAM PROFILE SHAPING BY COLLIMATION LENSLETS FOR HIGH POWER LASER DIODE BASED ANNEALING SYSTEM, by Dean Jennings, et al.

FIELD OF THE INVENTION

The invention relates generally to thermal processing of semiconductor substrates. In particular, the invention relates to laser thermal processing of semiconductor substrates.

BACKGROUND ART

Thermal processing is required in the fabrication of silicon and other semiconductor integrated circuits formed in silicon wafers or other substrates such as glass panels for displays. The required temperatures may range from relatively low temperatures of less than 250 degrees C to greater than 1400 degrees C and may be used for a variety of processes such as dopant implant annealing, crystallization, oxidation, nitridation, silicidation, and chemical vapor deposition as well as others.

For the very shallow circuit features required for advanced integrated circuits, it is greatly desired to reduce the total thermal budget in achieving the required thermal processing. The thermal budget may be considered as the total time at high temperatures necessary to complete device fabrication. The time that the wafer needs to stay at the highest temperature can be very short. The greater the total time that the wafer is subject to high temperatures, the more features such as implanted junctions will diffuse and loose their definition. For example, implanted junction depths may become deeper than desired due to diffusion.

Rapid thermal processing (RTP) uses radiant lamps which can be very quickly turned on and off to heat only the wafer and not the rest of the chamber. Pulsed laser annealing using very short (about 20 ns) laser pulses is effective at heating only the surface layer and not the underlying wafer, thus allowing very short ramp up and ramp down rates.

A more recently developed approach in various forms, sometimes called thermal flux laser annealing or dynamic surface annealing (DSA), is described in U.S. Pat. Nos. 7,005,601 and 6,987,240, the disclosures of which are incorporated herein by reference. The DSA system employs many CW diode lasers focused on an extremely narrow (0.07 mm) line beam to produce a very intense beam of light that strikes the wafer as a thin long line of radiation or line beam. The line beam is then scanned over the surface of the wafer in a direction perpendicular to the long dimension of the line beam.

The thinness of the line beam (e.g., 0.07 mm) ensures very short temperature rise and fall times and a short dwell time at the required temperature, e.g., 1300 degrees C, with respect to a fixed location on the wafer surface that is scanned once by the line beam. For example, the temperature of a fixed location on the wafer surface will increase from an ambient 450 degrees C to 1300 degrees C within 0.6 ms, assuming a scan rate within a range of about 50-300 mm/sec is employed. The advantage is that the wafer surface spends an extremely short amount of time at lower or intermediate temperatures (e.g., 500-900 degrees C) at which the higher silicon thermal conductivity promotes heating throughout the wafer and consequent diffusion and loss of underlying circuit feature definition. Instead, the wafer surface spends more time at the desired high temperature (e.g., 1300 degrees C) at which silicon thermal conductivity is lowest for minimum heating of the underlying features, and at which desired effects are maximum (e.g., annealing of implanted dopant impurities, annealing of pre-implant amorphization damage, etc.). The thinness of the line beam corresponds to the minimum resolvable spot size R of the laser beam optical system, which is governed by the following approximate formula:

$R = \lambda/2\, NA$, where $\lambda$ is the laser wavelength and NA is the numerical aperture of the optics. Numerical aperture is defined as:

$NA = n \sin \theta/2$, where n is the index of refraction and $\theta$ is the angle subtended by the beam between the aperture at the lens and the focal point in a simple or ideal system. In the DSA system referred to above, the wavelength is 810 nm and the angle $\theta$ is less than 60 degrees and n is the index of refraction of air (about 1).

These parameters provide a minimum resolvable spot size R corresponding to the small width of the line beam (0.07 mm). Within the preferred beam scanning rate range (50-300 mm/sec), each fixed wafer surface location spends less than about 0.5 ms near the peak temperature (e.g., 1300 degrees C).

The required level of the wafer surface peak temperature (1300 degrees C) requires a power density of about 220 kilo-Watts/cm$^2$. To reach this level, the DSA system employs a large number of 810 nm CW diode lasers focused on the same line beam image, as will be described later in this specification.

One problem recently encountered is that some annealing processes requires a longer time at or near the peak temperature (1300 degrees C), than the current dwell time of less than 0.5 ms. This dwell time may be sufficient to cause ion implanted dopant impurities to become substitutional in the semiconductor crystal lattice. However, it may be insufficient to completely cure pre-ion implantation amorphization defects. Pre-ion implantation amorphization is performed prior to ion implantation of dopant impurities to form shallow PN junctions to prevent channeling of the kinetic dopant ions through the crystal lattice below the desired junction depth. Amorphization prevents such channeling by ion bombardment of the wafer with heavier atomic species (oxygen, nitrogen, carbon), causing bombardment damage to at least partially convert the active semiconductor layer from a crystalline state to an amorphous state. The defects in the crystal are cured provided each wafer surface location has a sufficiently long dwell time near 1300 degrees C This may require a dwell time that is longer than the current 0.5 ms dwell time. Furthermore, conversion of the amorphized region back to a crystalline state essentially forms an epitaxial crystalline layer over the bulk crystalline layer, giving rise to another class of defects, namely boundary defects at the interface between the bulk crystal and the re-crystallized surface.

Such boundary defects have been found to be more persistent than the other types of defects, and require a significantly longer dwell time to completely cure or remove, as long as 2 to 3 ms near 1300 degrees C.

In order to provide such a long dwell time, the beam spot size must be enlarged, which essentially broadens the Gaussian profile of the beam intensity along the direction of scan, hereinafter referred to as the "fast axis". Unfortunately, if the Gaussian beam profile is widened by a given factor, then the slope of the leading edge of the Gaussian beam profile is reduced by approximately the same factor. This increases the temperature rise time (and fall time), thereby subjecting each location on the wafer surface to a longer time at a lower or intermediate temperature, and thus degrading the device structure through thermal diffusion, for example. Thus, widening the beam profile along the fast axis does not appear to be possible. Therefore there is a need for a DSA process in which the boundary defects and other defects in an ion implanted wafer can be annealed without device degradation due to greater thermal diffusion.

SUMMARY OF THE INVENTION

A dynamic surface anneal apparatus for annealing a semiconductor workpiece has a workpiece support for supporting a workpiece, an optical source and scanning apparatus for scanning the optical source and the workpiece support relative to one another along a fast axis. The optical source includes an array of laser emitters arranged generally in successive rows of the emitters, the rows being transverse to the fast axis. Plural collimating lenslets overlie respective ones of the rows of emitters and provide collimation along the fast axis. The selected lenslets have one or a succession of optical deflection angles corresponding to beam deflections along the fast axis for respective rows of emitters. Optics focus light from the array of laser emitters onto a surface of the workpiece to form a succession of line beams transverse to the fast axis spaced along the fast axis in accordance with the succession of deflection angles.

DETAILED DESCRIPTION OF THE INVENTION

Introduction:

Defects in an ion implanted wafer of the type that persist beyond a half millisecond at high temperature (1300 degrees C) are annealed or cured by providing a very long dwell time (e.g., 2-3 milliseconds) without compromising the extremely steep rising and falling edges of the Gaussian shaped line beam along the fast axis. In this way, boundary defects that are an artifact of pre-implant amorphization and post implant annealing are completely removed without incurring a corresponding penalty in thermal diffusion. All this is accomplished by focusing a first set of lasers on a first line beam image and focusing a second set of lasers on a second line beam image whose amplitude peak is displaced from the amplitude peak of the first line beam image along the direction of the fast axis (i.e., perpendicular to the length of the line beam). This displacement is preferably the width of the Gaussian profile of the line beam along the fast axis at an amplitude corresponding to half the peak amplitude of one of the two line beams. Both line beams have the same highly focused image with the minimum resolvable spot size of about 0.07 mm as before. The angle subtended between the optical paths of the two sets of lasers is less than one degree in order to achieve such a small displacement, and this angle depends upon the distance between the lasers and the wafer surface.

The net effect is the same extremely steep slope of the leading and trailing beam edges along the fast axis as with a single line beam, but with a dwell time at or near the peak temperature that is doubled from that of a single line beam. One of the laser line beams is the leading beam while the other is the trailing beam. The leading beam must raise the wafer surface temperature from about 400 degrees C to 1300 degrees C within 0.5 ms, and must therefore be of higher power density, while the trailing beam must simply maintain the wafer surface at, the elevated temperature (without increasing the temperature), and is therefore of a lesser power density.

The time-profile of the wafer surface temperature at each fixed location may be adjusted by adjusting the currents supplied to the two sets of lasers. Finer adjustment may be realized by providing a larger number of laser sets focused respectively on the corresponding number of line beams (e.g., four line beams), and programming the four current levels supplied to the four laser sets.

Figure 1:
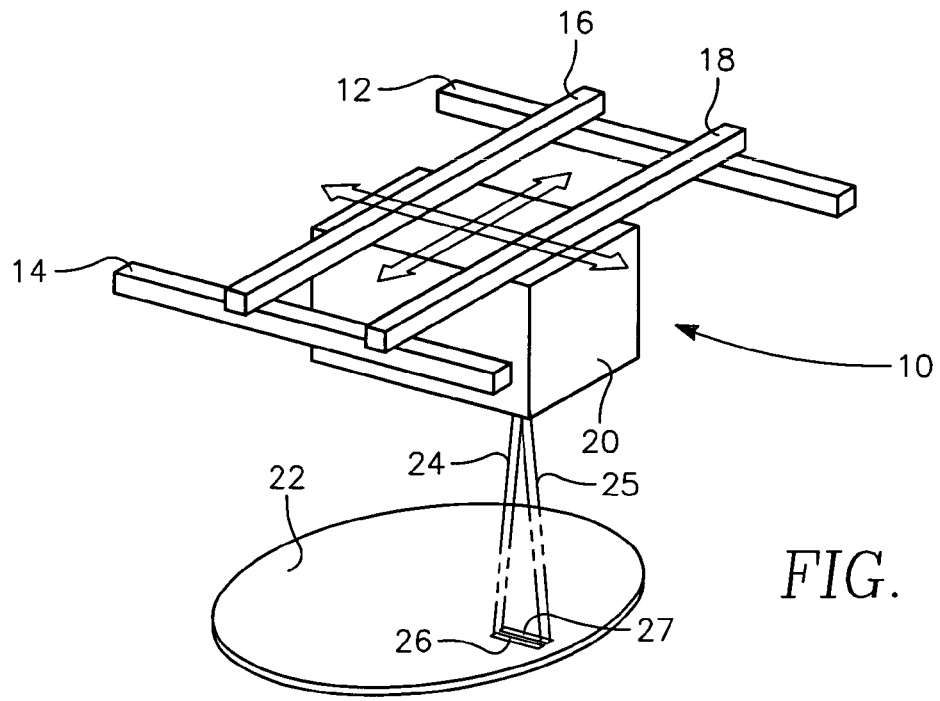
FIG. 1 is an orthographic representation of a thermal flux laser annealing apparatus employed in the present invention.

DSA Apparatus:

One embodiment of the DSA apparatus described in the above-referenced patent application is illustrated in the schematic orthographic representation of FIG. 1. A gantry structure 10 for two-dimensional scanning includes a pair of fixed parallel rails 12, 14. Two parallel gantry beams 16, 18 are fixed together a set distance apart and supported on the fixed rails 12, 14 and are controlled by an unillustrated motor and drive mechanism to slide on rollers or ball bearings together along the fixed rails 12, 14. A beam source 20 is slidably supported on the gantry beams 16, 18, and may be suspended below the beams 16, 18 which are controlled by unillustrated motors and drive mechanisms to slide along them. A silicon wafer 22 or other substrate is stationarily supported below the gantry structure 10. The beam source 20 includes a laser light source and optics (described below) to produce two closely spaced downwardly directed fan-shaped beams 24 and 25 that strike the wafer 22 as leading and trailing line beams 26 and 27, respectively, extending generally parallel to the fixed rails 12, 14, in what is conveniently called the slow direction. As will be described below, the second line beam 27 is parallel to the first line beam 26 and displaced from it by a distance corresponding to the minimum resolvable spot size of the optical system. How that is accomplished is discussed later in this specification.

Although not illustrated here, the gantry structure further includes a Z-axis stage for moving the laser light source and optics in a direction generally parallel to the fan-shaped beam 24 to thereby controllably vary the distance between the beam source 20 and the wafer 22 and thus control the focusing of the line beam 26 on the wafer 22. Exemplary dimensions of the line beam 26 include a length of 1 cm and a width of 66 microns with an exemplary power density of 220 kW/cm$^2$. Alternatively, the beam source and associated optics may be stationary while the wafer is supported on a stage which scans it in two dimensions.

In typical operation, the gantry beams 16, 18 are set at a particular position along the fixed rails 12, 14 and the beam source 20 is moved at a uniform speed along the gantry beams 16, 18 to scan the line beams 26, 27 perpendicularly to its long dimension in a direction conveniently called the fast direction. The two line beams 26, 27 are thereby scanned from one side of the wafer 22 to the other to irradiate a 1 cm swath of the wafer 22. The line beams 26, 27 are sufficiently narrow and the scanning speed in the fast direction is sufficiently fast so that a particular area of the wafer is only momentarily exposed to the optical radiation of the line beams 26, 27 but the intensity at the peak of the line beam is sufficient to heat the surface region to very high temperatures. However, the deeper portions of the wafer 22 are not significantly heated and further act as a heat sink to quickly cool the surface region. Once the fast scan has been completed, the gantry beams 16, 18 are moved along the fixed rails 12, 14 to a new position such that the line beam 26 is moved along its long dimension extending along the slow axis. The fast scanning is then performed to irradiate a neighboring swath of the wafer 22. The alternating fast and slow scanning are repeated, perhaps in a serpentine path of the beam source 20, until the entire wafer 22 has been thermally processed.

The optics beam source 20 includes an array of lasers in order to realize the high optical power density (220 kW/cm$^2$) required. The optical system described below focuses the beams from the array of lasers into two closely spaced parallel line beams, each of width 66 microns. One optical system that is suitable for doing this is orthographically illustrated in FIGS. 2 and 3, in which laser radiation at about 810 nm is produced in an optical system 30 from two laser bar stacks 32, one of which is illustrated in end plan view in FIG. 4. Each laser bar stack 32 includes 14 parallel bars 34, generally corresponding to a vertical p-n junction in a GaAs semiconductor structure, extending laterally about 1 cm and separated by about 0.9 mm. Typically, water cooling layers are disposed between the bars 34. In each bar 34 are formed 49 emitters 36, each constituting a separate GaAs laser emitting respective beams having different divergence angles in orthogonal directions. The illustrated bars 34 are positioned with their long dimension extending over multiple emitters 36 and aligned along the slow axis and their short dimension corresponding to the less than 1-micron p-n depletion layer aligned along the fast axis. The small source size along the fast axis allows effective collimation along the fast axis. The divergence angle is large along the fast axis and relatively small along the slow axis.

Returning to FIGS. 2 and 3, individual half-cylindrical lenslets 40 are positioned over individual laser bars 34 to collimate the laser light in a narrow beam along the fast axis. The lensets 40 may be bonded with adhesive on the laser stacks 32 and aligned with the bars 34 to extend over the emitting areas 36. As will be described in more detail later in this specification, some of the laser bars 34 and their lenlets 40 are covered by prisms 44 that deflect the light by an angle less than 1 degree to form the second (trailing) line beam 27 depicted in FIG. 1. The angle of the prisms 44 and the displacement between the two line beams 26, 27 are so infinitesimally small relative to the scale of the drawings of FIGS. 1-4 that their size in the drawings has been greatly exaggerated in order for them to be slightly visible in the drawings.

Figure 2:
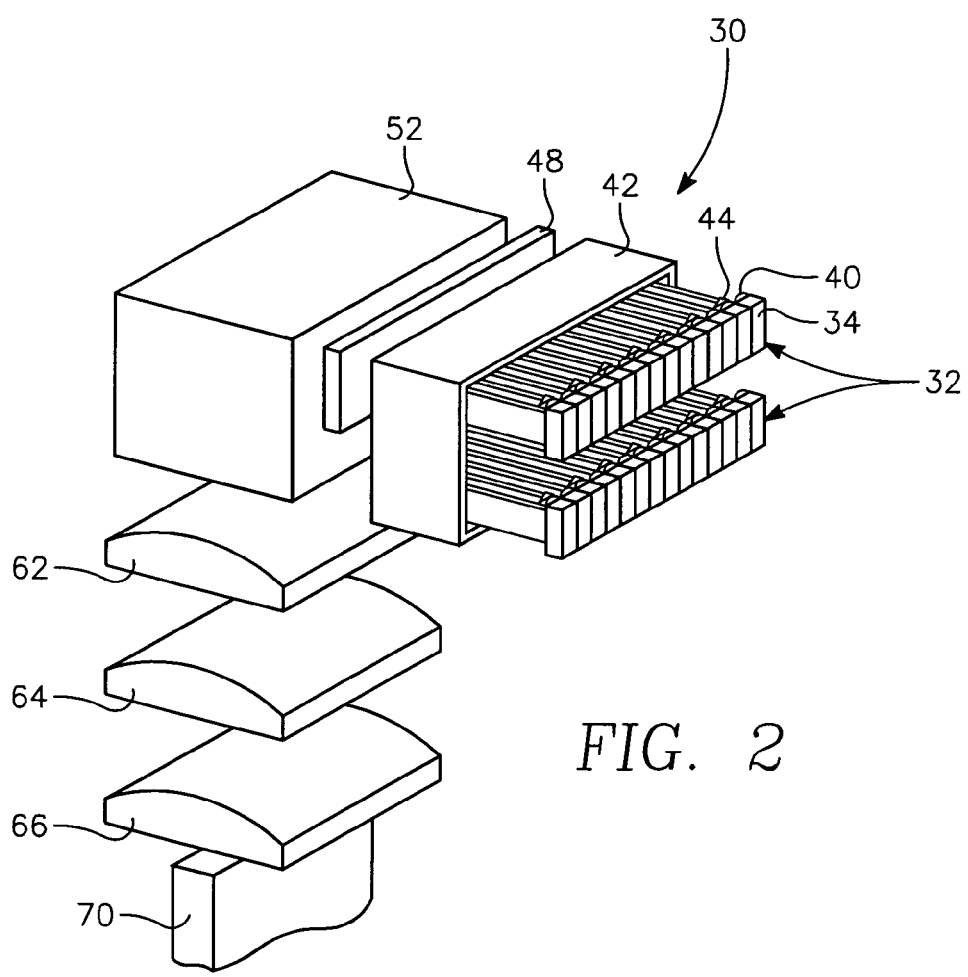
FIGS. 2 and 3 are orthographic views from different perspectives of optical components of the apparatus of FIG. 1.
Figure 3:
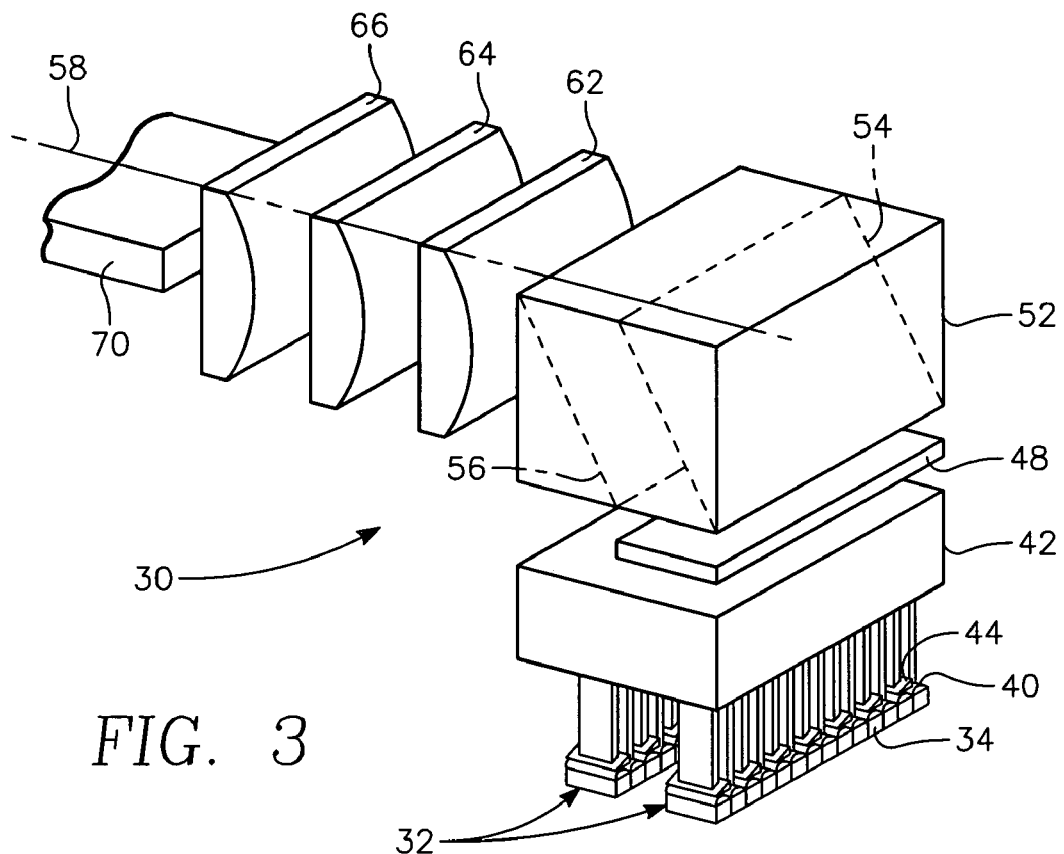
Figure 4:
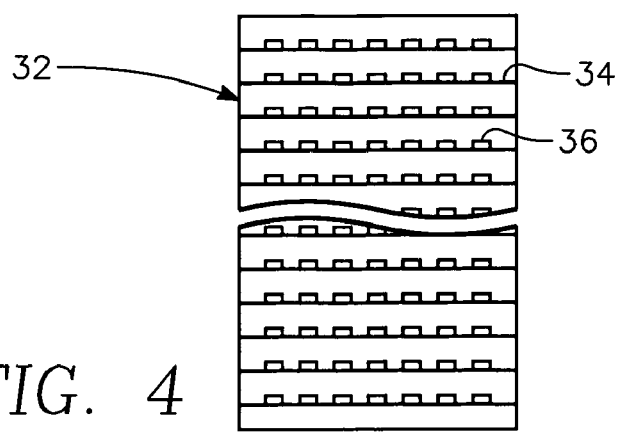
FIG. 4 is an end plan view of a portion of a semiconductor laser array in the apparatus of FIG. 1.

The optics beam source 20 can further include conventional optical elements. Such conventional optical elements can include an interleaver and a polarization multiplexer, although the selection by the skilled worker of such elements is not limited to such an example. In the example of FIGS. 2 and 3, the two sets of beams from the two bar stacks 32 are input to an interleaver 42, which has a multiple beam splitter type of structure and having specified coatings on two internal diagonal faces, e.g., reflective parallel bands, to selectively reflect and transmit light. Such interleavers are commercially available from Research Electro Optics (REO). In the interleaver 42, patterned metallic reflector bands are formed in angled surfaces for each set of beams from the two bar stacks 32 such that beams from bars 34 on one side of the stack 32 are alternatively reflected or transmitted and thereby interleaved with beams from bars 34 on the other side of the stack 32 which undergo corresponding selective transmission/reflection, thereby filling in the otherwise spaced radiation profile from the separated emitters 36.

A first set of interleaved beams is passed through a half-wave plate 48 to rotate its polarization relative to that of the second set of interleaved beams. Both sets of interleaved beams are input to a polarization multiplexer (PMUX) 52 having a structure of a double polarization beam splitter. Such a PMUX is commercially available from CVI Laser Inc. First and second diagonal interface layers 54, 56 cause the two sets of interleaved beams to be reflected along a common axis from their front faces. The first interface 54 is typically implemented as a dielectric interference filter designed as a hard reflector (HR) while the second interface 56 is implemented as a dielectric interference filter designed as a polarization beam splitter (PBS) at the laser wavelength. As a result, the first set of interleaved beams reflected from the first interface layer 54 strikes the back of the second interface layer 56.

Because of the polarization rotation introduced by the half-wave plate 48, the first set of interleaved beams passes through the second interface layer 56. The intensity of a source beam 58 output by the PMUX 52 is doubled from that of the either of the two sets of interleaved beams.

Although shown separated in the drawings, the interleaver 42, the half-wave plate 48, and the PMUX 52 and its interfaces 54, 56, as well as additional filters that may be attached to input and output faces are typically joined together by a plastic encapsulant, such as a UV curable epoxy, to provide a rigid optical system. There is a plastic bond between the lenslets 40 and the laser stacks 32, on which they are aligned to the bars 34. The source beam 58 is passed through a set of cylindrical lenses 62, 64, 66 to focus the source beam 58 along the slow axis.

Figure 5:
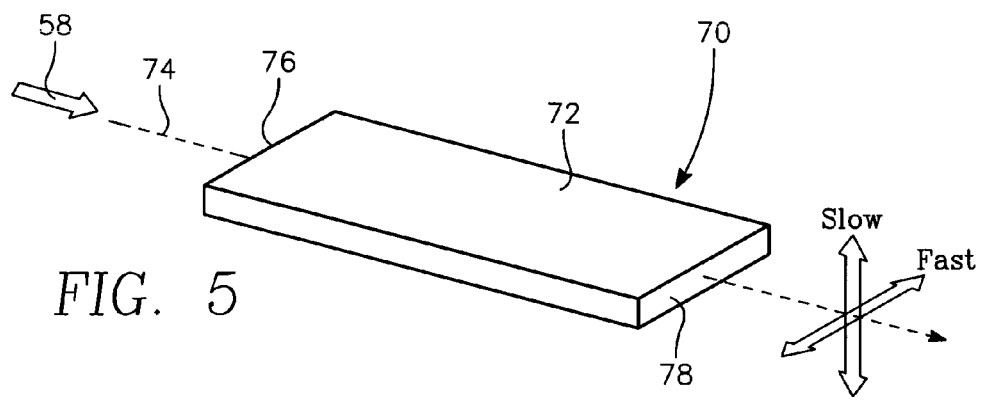
FIG. 5 is an orthographic view of a homogenizing light pipe for the apparatus of FIG. 1.

A one-dimensional light pipe 70 homogenizes the source beam along the slow axis. The source beam, focused by the cylindrical lenses 62, 64, 66, enters the light pipe 70 with a finite convergence angle along the slow axis but substantially collimated along the fast axis. The light pipe 70, more clearly illustrated in the orthographic view of FIG. 5, acts as a beam homogenizer to reduce the beam structure along the slow axis introduced by the multiple emitters 36 in the bar stack 32 spaced apart on the slow axis. The light pipe 70 may be implemented as a rectangular slab 72 of optical glass having a sufficiently high index of refraction to produce total internal reflection. It has a short dimension along the slow axis and a longer dimension along the fast axis. The slab 72 extends a substantial distance along an axis 74 of the source beam 58 converging along the slow axis on an input face 76. The source beam 58 is internally reflected several times from the top and bottom surfaces of the slab 72, thereby removing much of the texturing along the slow axis and homogenizing the beam along the slow axis when it exits on an output face 78. The source beam 58, however, is already well collimated along the fast axis (by the cylindrical lenslets 40) and the slab 72 is wide enough that the source beam 58 is not internally reflected on the side surfaces of the slab 72 but maintains its collimation along the fast axis.

The light pipe 70 may be tapered along its axial direction to control the entrance and exit apertures and beam convergence and divergence. The one-dimensional light pipe can alternatively be implemented as two parallel reflective surfaces corresponding generally to the upper and lower faces of the slab 72 with the source beam passing between them. The source beam output by the light pipe 70 is generally uniform.

Figure 6:
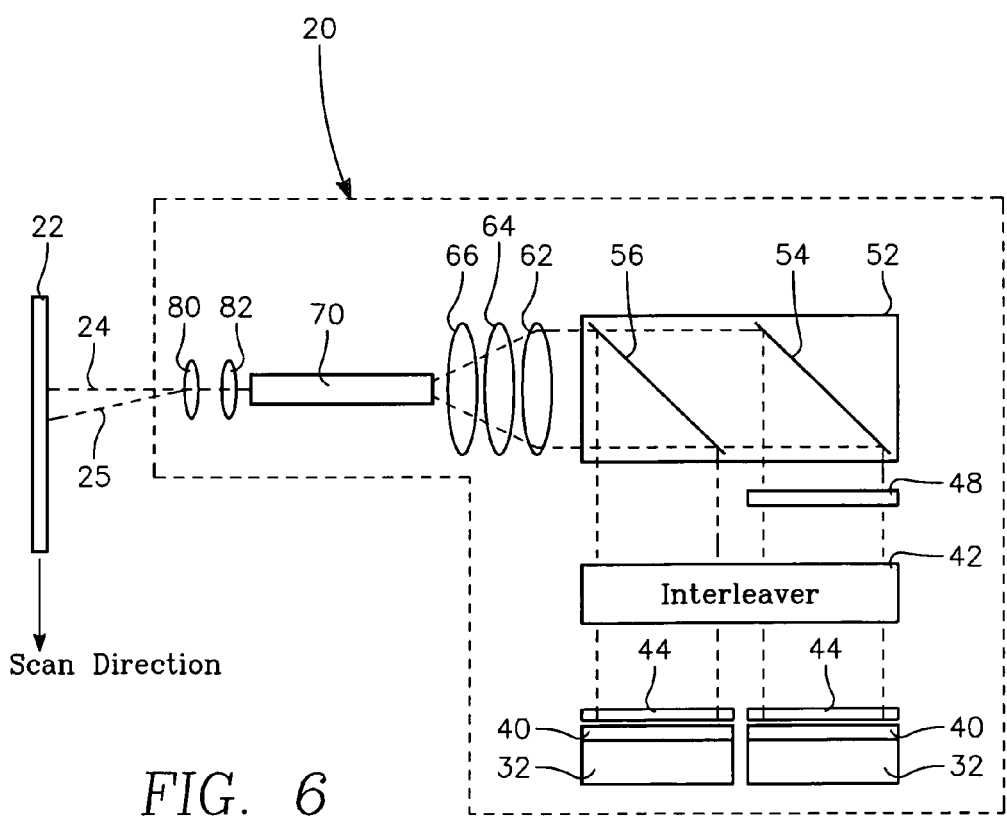
FIG. 6 is a schematic diagram corresponding to FIGS. 2 and 3.

As further illustrated in the schematic view of FIG. 6, further anamorphic lens set or optics 80, 82 expands the output beam in the slow axis and includes a generally spherical lens to project the desired line beam 26 on the wafer 22. The anamorphic optics 80, 82 shape the source beam in two dimensions to produce a narrow line beam of limited length. In the direction of the fast axis, the output optics have an infinite conjugate for the source at the output of the light pipe (although systems may be designed with a finite source conjugate) and a finite conjugate at the image plane of the wafer 22 while, in the direction of the slow axis, the output optics has a finite conjugate at the source at the output of the light pipe 70 and a finite conjugate at the image plane. Further, in the direction of the slow axis, the nonuniform radiation from the multiple laser diodes of the laser bars is homogenized by the light pipe 70. The ability of the light pipe 70 to homogenize strongly depends on the number of times the light is reflected traversing the light pipe 70. This number is determined by the length of the light pipe 70, the direction of the taper if any, the size of the entrance and exit apertures as well as the launch angle into the light pipe 70. Further anamorphic optics focus the source beam into the line beam of desired dimensions on the surface of the wafer 22.

Figure 7:
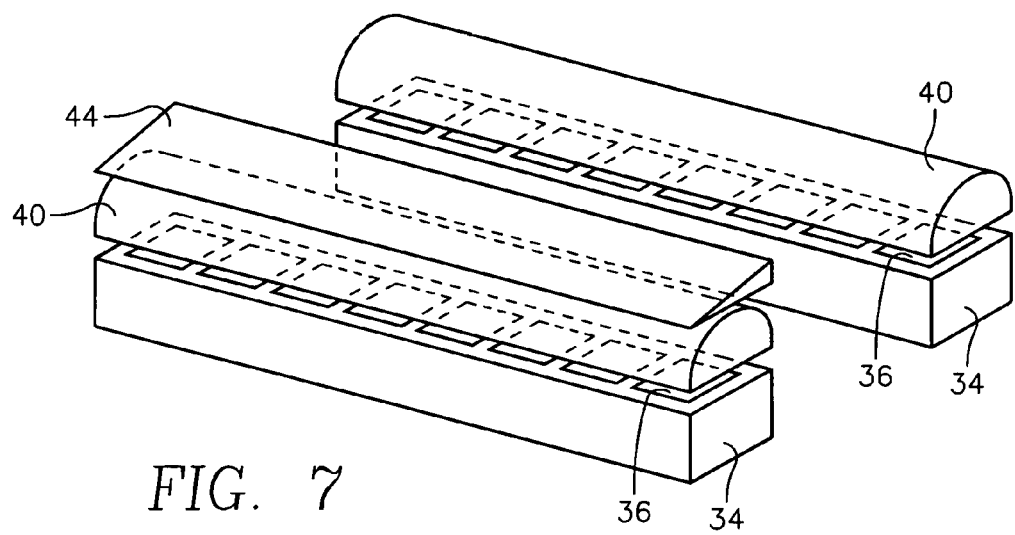
FIG. 7 is a perspective view of a portion of the beam source of an embodiment of the invention.
Figure 8:
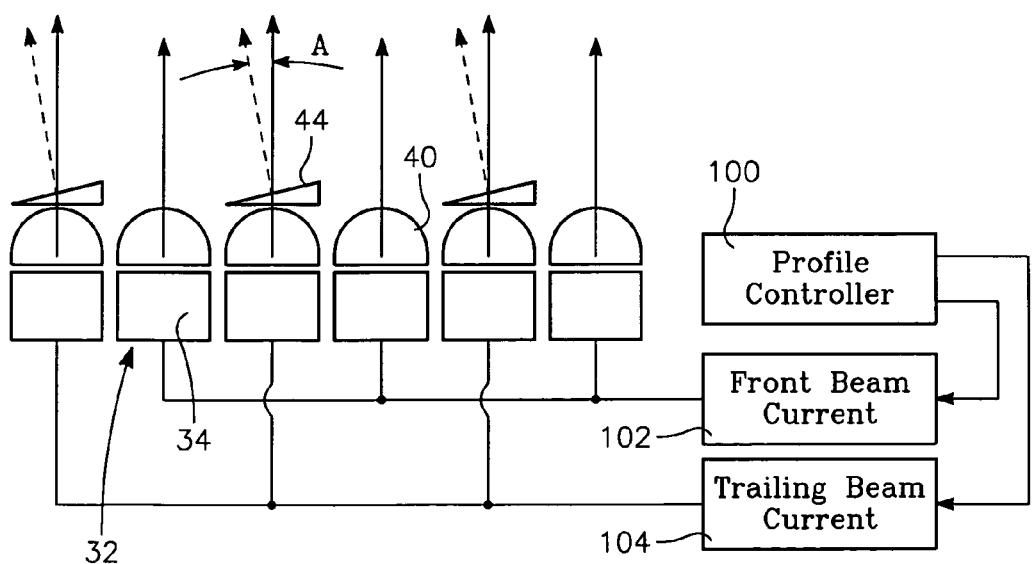
FIG. 8 is an end view corresponding to FIG. 7 and further illustrating a controller for varying the fast axis power density profile of the two line beams.

Programmable Beam Profile for Dwell Time and Temperature Profile Control:

Referring to FIGS. 6 and 8, one group of laser bars 34 (e.g., alternate bars 34) radiate through corresponding cylindrical lenslets 40 to the optics 42, 52, etc. The remaining ones of the lasers bars 34 radiate through corresponding cylindrical lenslets 40 and through individual prisms 44 overlying respective ones of the lenslets 40. Each prism 44 deflects the beam by an angle (A) less than 1 degree through an angle of rotation about an axis parallel with the fast axis to produce a beam deflection perpendicular to the fast axis. The first group of laser bars 34 whose beams are undeflected generate the leading beam 24. The second group of laser bars 34 whose beams are deflected by the respective prisms 44 generate the trailing beam 25. The perspective view of FIG. 7 shows two of the laser bars 34 forming two parallel rows of emitters 36, both covered by respective cylindrical lenslets 40, and one of the lenslets 40 being covered by a prism 44. FIG. 8 illustrates how the power densities of the leading and trailing beams 24, 25 are independently governed by a profile controller 100 controlling current supplies 102, 104 that drive the emitters 36 of alternate laser bars 34. The first current supply 102 is the front beam current supply because it is coupled to each of the laser bars not covered by any of the prisms 40. The second current supply 104 is the trailing beam current supply because it is coupled to each of the laser bars covered by a prism 44. Each prism 44 deflects the corresponding laser beam to form the trailing beam 25. The two line beams 26, 27 (FIG. 1) imaged on the wafer 22 by the leading and trailing beams 24, 25 are separated by a displacement determined by the deflection angle of the prisms 44. The terms "front" and "trailing" apply to an embodiment in which the beam is scanned across the wafer in a particular direction. If this direction is reversed, then the beams deflected by the prisms 44 form the leading or "front" beam 26 while the undeflected beams form the trailing beam 27. The invention may be carried out in either mode, and therefore the terms such as "front" and "trailing", for example, are employed interchangeably with respect to the embodiment of FIG. 6.

Figure 9:
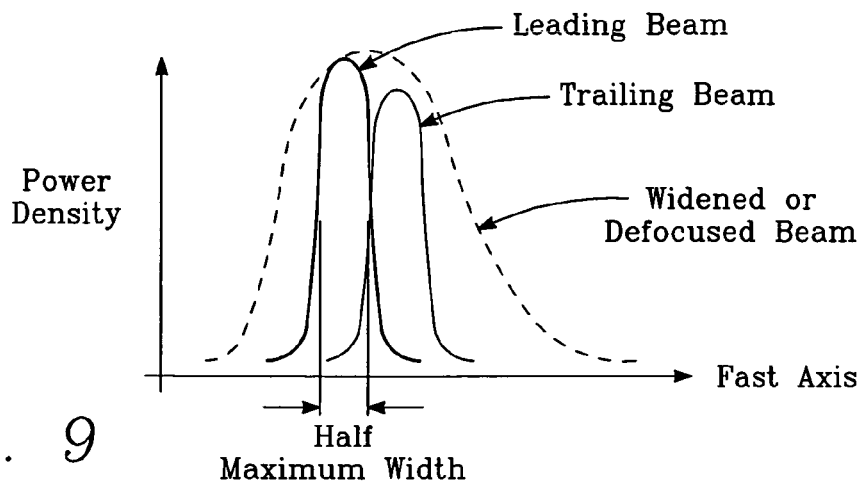
FIG. 9 is a graph depicting the fast-axis power density profile obtained with the apparatus of FIGS. 7 and 8.

In operation, the power density of the trailing line beam 27 may be significantly less than that of the front line beam 26. This is because the front line beam 26 must have sufficient power density to raise the temperature of the wafer surface rapidly through the lower temperature ranges where the higher thermal conductivity of the wafer makes it more difficult to heat the surface, until the wafer surface reaches the peak temperature. The trailing line beam merely maintains this temperature, which requires less power density, to avoid raising the wafer surface temperature beyond the maximum desired temperature (1300 degrees C). Therefore, as indicated in FIG. 9, the trailing line beam has a fast axis profile whose peak power density is significantly lower than that of the leading line beam. The difference between the peak power density levels of the two beams is set by the profile controller 100 of FIG. 8.

Figure 10:
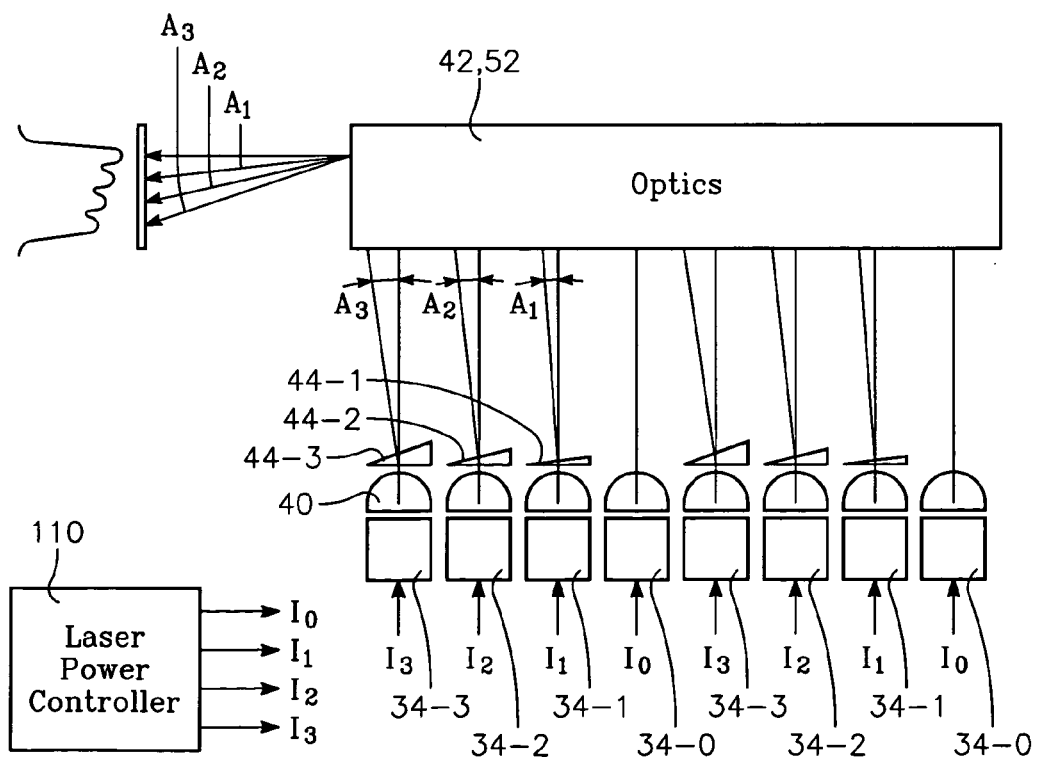
FIG. 10 is a schematic diagram of another embodiment of the invention employing several displace Gaussian beams with a programmable fast-axis profile.
Figure 11A:
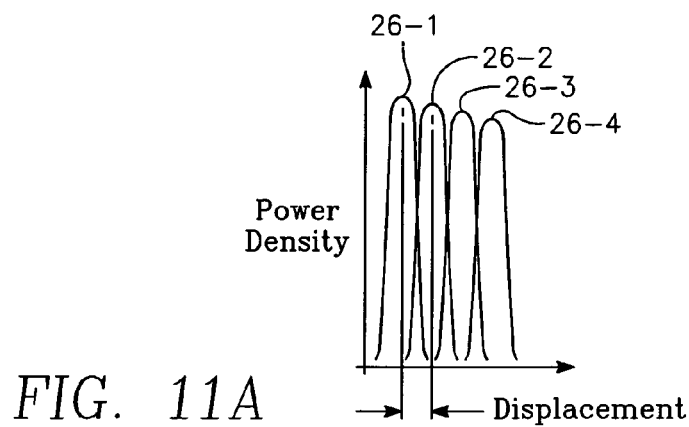
FIGS. 11A through 11E are graphs of different fast-axis power density profiles that can be selected with a programmable controller of the DSA apparatus of FIG. 10.

FIG. 10 depicts an embodiment providing several (i.e., four) trailing beams in succession, each one with an independently adjustable power density. In FIG. 10, the laser bars 34 are divided into four groups. The one group of laser bars 34-0 produce laser radiation that is undeflected, to form the front beam. Another group of laser bars 34-1 produce radiation that is deflected by prisms 44-1 through a small angle A1 to produce the first trailing beam. A further group of laser bars 34-2 produce radiation that is deflected by prisms 44-2 through an angle A2 that is greater than A1. Another group of laser bars 34-3 produce radiation that is deflected by prisms 44-3 through an angle A3 that is greater than A2. The four line beams 26-1, 26-2, 26-3, 26-4 (FIG. 11A) are focused by the optics (42, 52, etc. of FIGS. 2-6) on the wafer surface. In the special case in which the four line beams 26-1, 26-2, 26-3, 26-4 have the same power density, their power density profiles along the fast axis are of identical Gaussian shapes, but are shifted from one another along the fast axis by the same peak-to-peak displacement, as depicted in FIG. 11A. This displacement is determined by the succession of deflection angles A1, A2, A3 imposed by the prisms 44-1, 44-2, 44-3. Preferably, the angles A1, A2, A3 are selected so that the peak-to-peak displacement between neighboring line beams is at least approximately (if not exactly) equal to the half-maximum beam width (depicted in FIG. 9) of a single line beam (e.g., of the front beam). Equivalently, the displacement may correspond to the minimum resolvable spot size of the beam, discussed previously in this specification. The deflection angles are all less than 1 degree and in reality would not be detectable in the drawing of FIG. 10. These angles have been exaggerated in FIG. 10 for the sake of illustration.

Figures 11B, 11C, 11D:
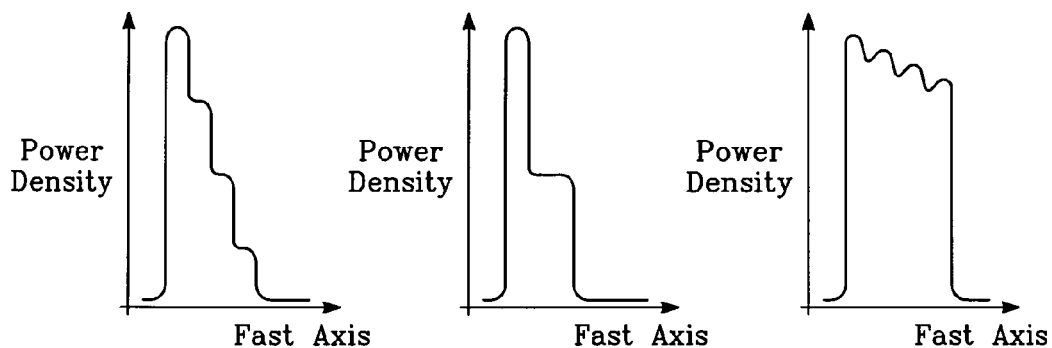
Figure 11E:
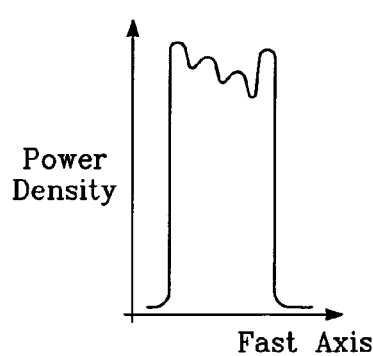

The power density levels produced by the different groups of laser bars 34-0, 34-1, 34-2, 34-3 are independently adjustable by a laser power controller 110 that furnishes independent supply currents I0, I1, I2, I3 to the respective laser bars 34-0, 34-1, 34-2, 34-3. The laser power controller 110 therefore controls the fast axis power density profile produced by the array of lasers. While their power densities may be the same (corresponding to the power density profile of FIG. 11A), it is preferable for the power densities of the trailing line beams to be less than that of the front or leading line beam, in accordance with the various power density profiles of FIGS. 11B, 11C or 11D. The successive line beam supply current levels I0, I1, I2, I3 may be adjusted by the controller 110 to produce a staircase profile of successively decreasing power density levels as in FIG. 11B, or the single staircase of FIG. 11C, or the gradual staircase of FIG. 11D. As another alternative, the amplitude profile may fall after the front or leading line beam and then increase from the third to last line beam, as depicted in FIG. 11E. Although not depicted in the drawings, the profile may be further adjusted to produce an ascending staircase pattern instead of the descending staircase profiles of FIGS. 11B-11D.

Figure 12A:
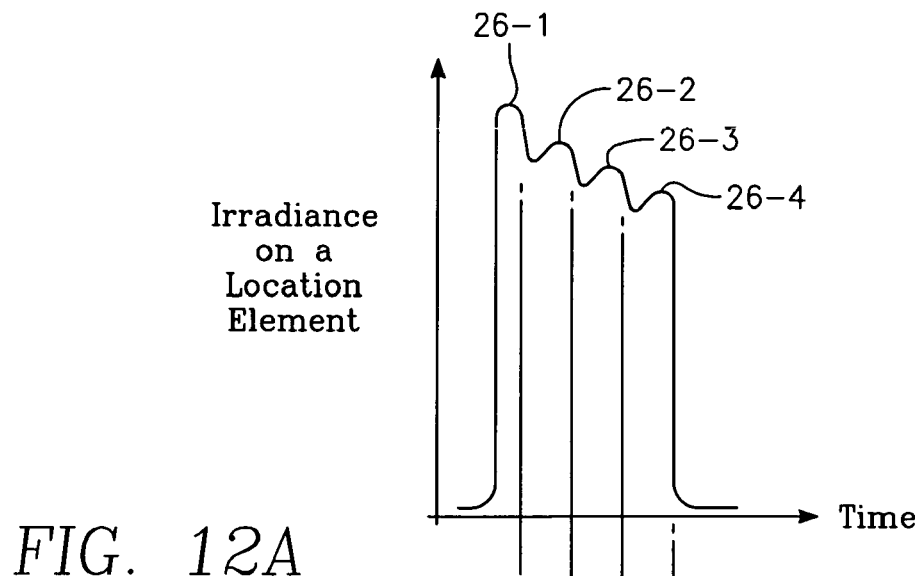
FIG. 12A is a graph depicting a preferred power density profile over time generated with the DSA apparatus of FIG. 10.
Figure 12B:
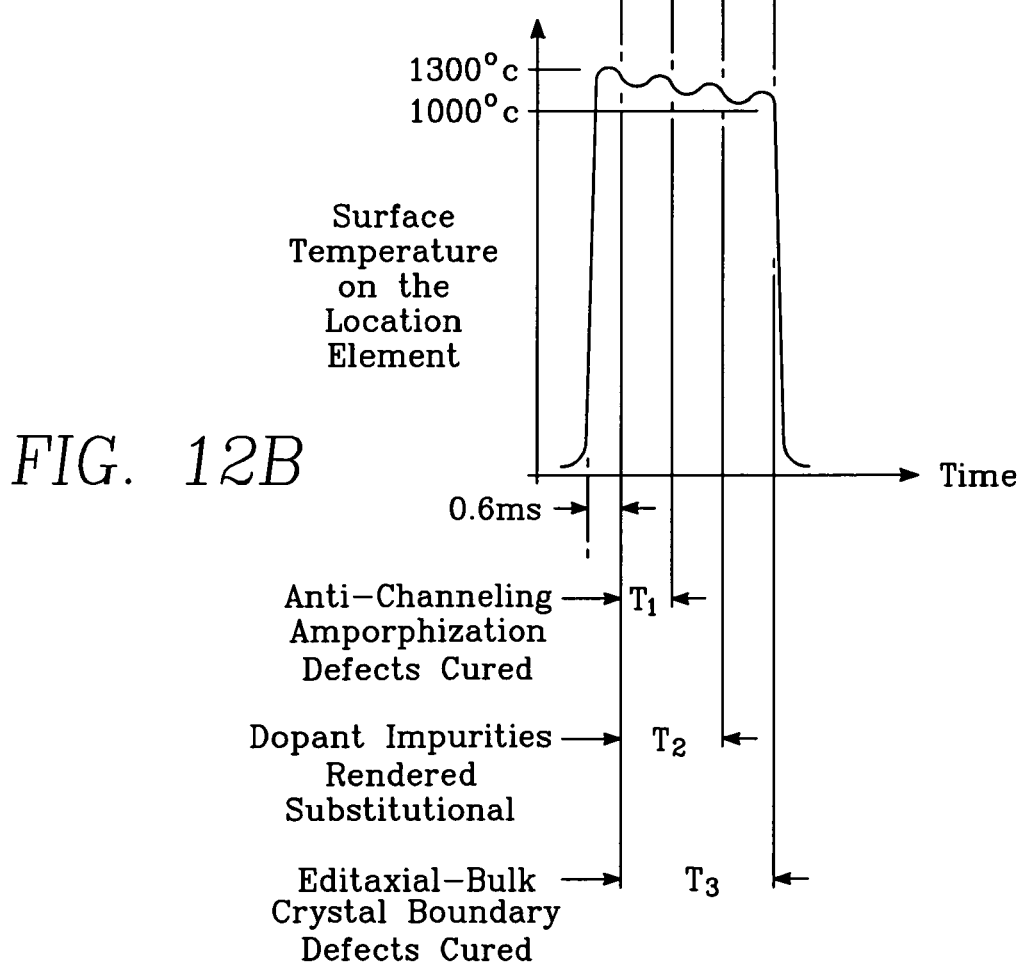
FIG. 12B is a graph contemporaneous with the graph of FIG. 12A and depicting the time behavior of the temperature of a fixed spot on the wafer surface resulting from the power density profile of FIG. 12A.

The presently preferred power density profile of the succession of line beams is illustrated in FIG. 12A. FIG. 12A depicts the power density incident upon a particular spot on the wafer surface as a function of time. (If FIG. 12A were converted to depict power density distribution along the fast axis at a fixed instant in time, then the graph would remain unchanged, depending upon the units chosen.) The leading line beam 26-1 has the highest peak power density, while the successive trailing line beams 26-2, 26-3, 26-4 have a lesser peak power density, which is the same for each of them. The strong leading beam 26-1 of FIG. 12A has sufficient power density to overcome the high silicon thermal conductivity to rapidly heat the wafer surface spot to 1300 degrees C. The trailing beams 26-2, 26-3, 26-4 that follow have a lesser power density that is sufficient only to maintain the 1300 degree C wafer temperature at the spot and not exceed it. FIG. 12B depicts the temperature behavior over time of the same wafer surface spot that results from the beam profile of FIG. 12A. The temperature rises rapidly from 400 degrees C to 1300 degrees C with the leading edge of the front beam. The temperature of the spot then remains at about 1300 degrees C for 3 ms, with slight undulations in the temperature corresponding with the peaks of the successive beams. After about 3 ms, the temperature falls rapidly to 400 degrees C with the trailing edge of the last line beam.

Figure 13:
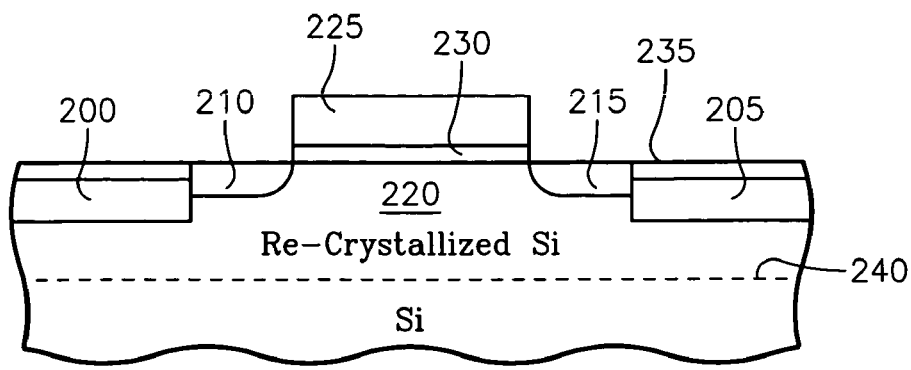
FIG. 13 is a cut-away side view of a semiconductor device formed using the DSA apparatus of the invention.

FIG. 12B indicates the succession of effects of the laser radiation in a post-ion implantation DSA annealing process using the beam profile of FIG. 12A. During an initial time interval (T1), ion bombardment damage in the semiconductor material incurred during a pre-implant amorphization process is annealed to convert the semiconductor material from a partially amorphous state to a crystalline state. During a further time interval, T2, the implanted dopant impurities are rendered substitutional in the semiconductor crystal lattice. During a yet further time interval T3, boundary defects formed at the interface between the bulk crystal and the re-crystallized zone are cured. FIG. 13 illustrates the location of such boundary defects. The boundary defects arise when the amorphized semiconductor surface layer is re-crystallized to form an epitaxial crystal layer over the bulk crystal. The two crystal zones may not align perfectly at the boundary between them, giving rise to misalignments that are defects. Such defects may require as long as 3 ms at 1300 degrees C. (i.e., the entire duration of the multiple line beams of FIG. 12A) to completely anneal or cure.

Figure 14:
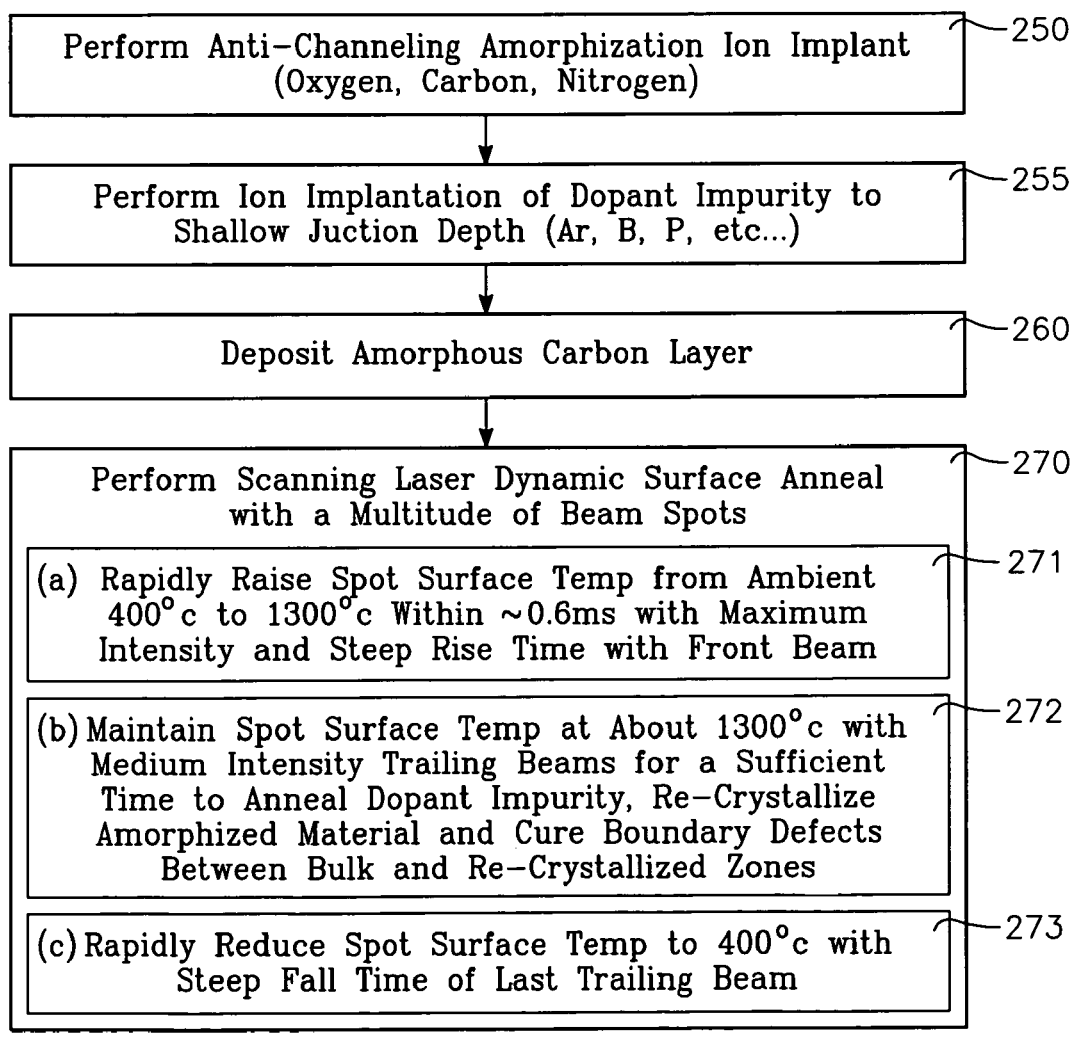
FIG. 14 depicts a DSA process employing the apparatus of FIG. 10.

FIG. 14 depicts an ion implantation process for forming ultra-shallow PN junctions such as source-drain extension implants in the surface of a silicon wafer. The structure to be formed is depicted in FIG. 13, in which ion implanted source-drain extensions 200, 205 are implanted between deep source-drain contact regions 210, 215 and a semiconductor channel region 220 underlying a gate electrode 225 insulated from the channel region 220 by a thin gate dielectric layer 230. In the first step of the process of FIG. 14 (block 250), the surface region extending from the top surface 235 of the wafer to the horizontal dashed line 240 is converted from a pure crystalline state to an at least partially amorphous state by ion bombarding the wafer with heavy ions (e.g., oxygen, nitrogen, carbon, germanium) to break the crystal bonds. This ion bombardment is carried out at an energy level at which the distribution of ions in the wafer extends down to the dashed line 240 and is virtually cut-off below that line. The purpose of this amorphization step is to prevent channeling of dopant impurity ions that are to be implanted in the next step of the process. Channeling is made possible by the regular crystalline structure of the silicon wafer, and is prevented by converting the crystalline structure to an amorphous one to a sufficient depth (corresponding to the dashed line 240 of FIG. 13).

The next step (block 255 of FIG. 14) is to implant a dopant impurity to form, for example, the source drain extensions 210, 215. The dopant impurity may be As, P, B or other species. This step may be preceded by masking steps to shield areas of the wafer that are not to be implanted in this step. The ion energy is selected so that the implanted ion distribution does not extend below the desired depth, such as the ultra-shallow depth of the source drain extensions 210, 215 for example.

Optionally, prior to performing a DSA process employing the apparatus of FIGS. 1-10, an optical absorber layer may be deposited on the wafer surface (block 260 of FIG. 14). This step may be carried out in accordance with the low-temperature plasma process and apparatus described in U.S. patent application Ser. No. 11/131,904, filed May 17, 2005, entitled A SEMICONDUCTOR JUNCTION FORMATION PROCESS INCLUDING LOW TEMPERATURE PLASMA DEPOSITION OF AN OPTICAL ABSORPTION LAYER ND HIGH SPEED OPTICAL ANNEALING by Kartik Ramaswamy, et al. and assigned to the present assignee. The optical absorber layer may be amorphous carbon, for example.

The next step (block 270) is to perform the scanning laser DSA process using multiple line beams with a configurable beam profile. A first sub-step (block 271) of this step is to rapidly raise the temperature of a newly encountered wafer surface spot (or line of spots) from an ambient temperature of 400-450 degrees C up to 1300 degrees C using the steep leading edge of the front beam 26-1 (FIG. 12A). The next sub-step (block 272) is to maintain the wafer temperature at about 1300 degrees C for a sufficient time (e.g., 3 ms) to (a) re-crystallize the amorphized surface region, (b) render the implanted dopant impurities substitutional in the re-crystallized lattice and (c) cure the defects at the boundary between the re-crystallized zone and the underlying bulk crystal. The final sub-step (block 273) is to rapidly reduce the spot surface temperature in accordance using the steep trailing edge of the last trailing beam 26-4 (FIG. 12A).

Figure 15:
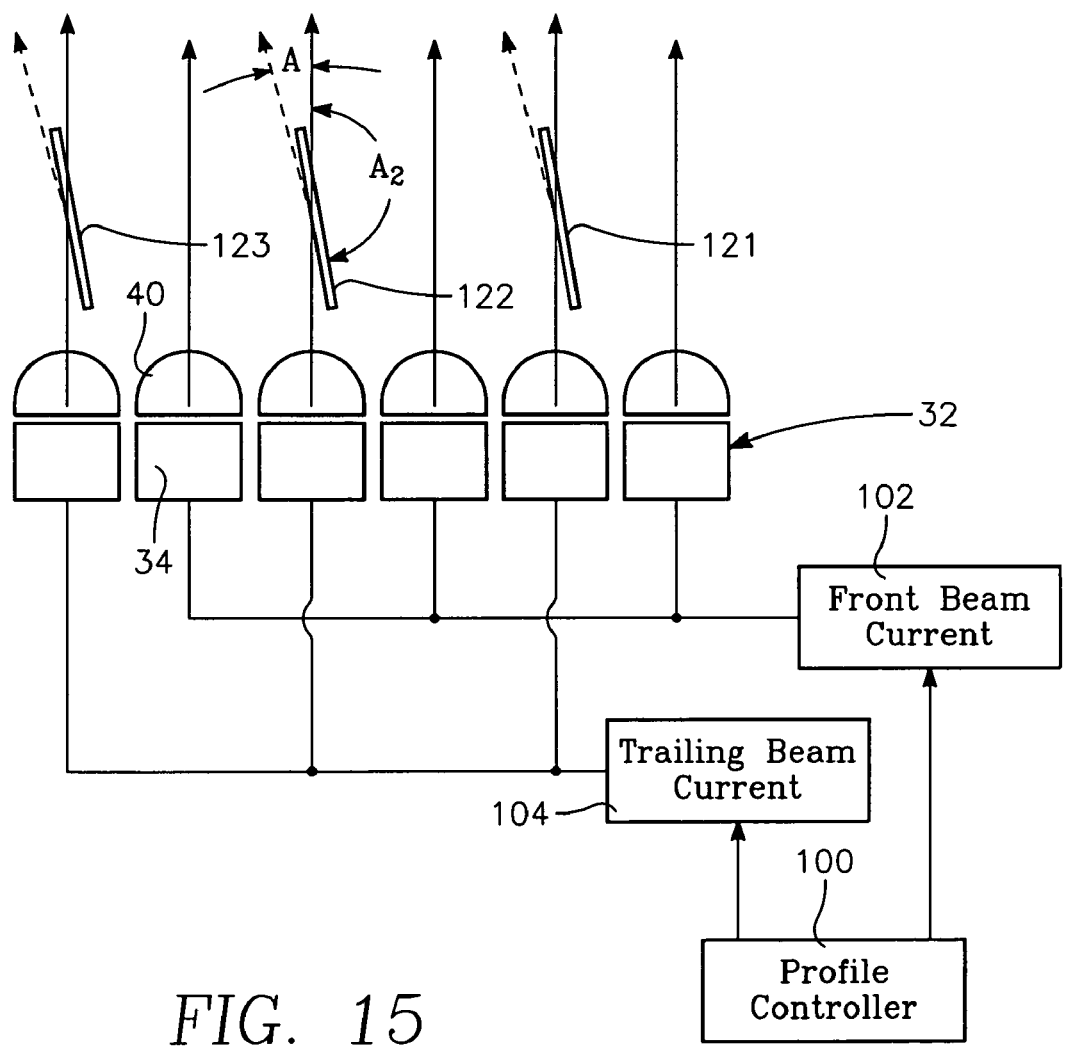
FIG. 15 is a schematic diagram depicting a first modification of the embodiment of FIG. 8 employing beam deflecting mirrors.

FIG. 15 depicts a modification of the embodiment of FIG. 8 in which the prisms 44 are replaced by separate mirrors 121, 122, 123 that deflect the beams from alternate laser bars 34 in the same manner that the prisms 44 deflected the beams in the embodiment of FIG. 8. If the beam deflection angle is A, then the angle of each mirror 121, 122, 123 relative to the beam direction emerging from each laser bar 34 is A/2.

Figure 16:
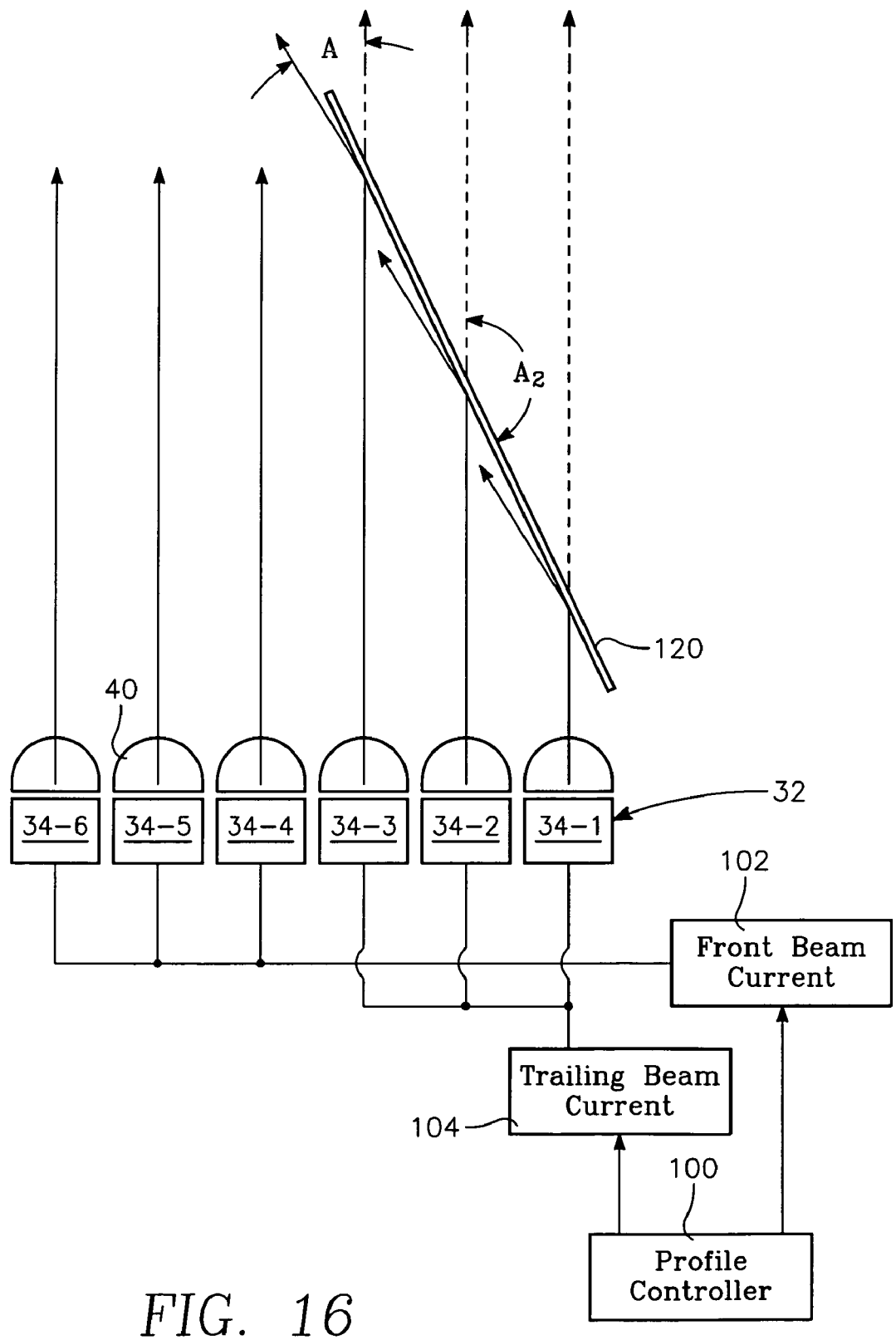
FIG. 16 is a schematic diagram depicting a second modification of the embodiment of FIG. 8 employing a single beam deflecting mirror.

FIG. 16 depicts a simpler version of the embodiment of FIG. 15, in which a single optical element 120, which may be a mirror or a prism, deflects the beams from a succession of lasers bars 34-1, 34-2, 34-3, etc., to produce the trailing line beam, while the beams from the other laser bars 34-4, 34-5, 34-6 are undeflected to form the leading line beam. In the case in which the optical element 120 of FIG. 16 is a mirror rather than a prism, for a beam deflection angle A, the angle of the optical element 120 relative to the beam direction emerging from each laser bar 34 is A/2, as in the embodiment of FIG. 15.

Figure 17:
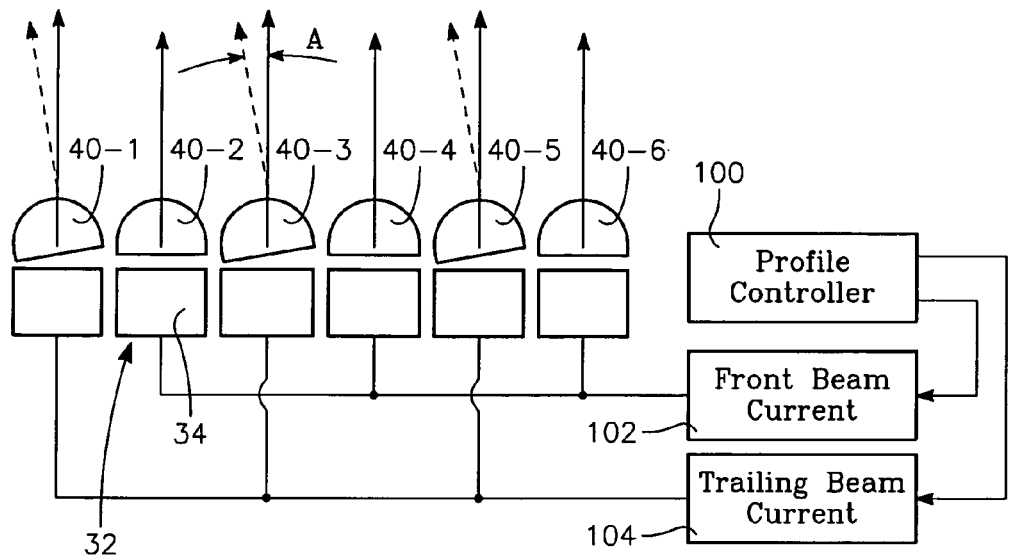
FIGS. 17 and 18 depict a third modification of the embodiment of FIG. 8 in which selected ones of the fast-axis collimating cylindrical lenses are rotated through the desired beam-deflecting angle.
Figure 18:
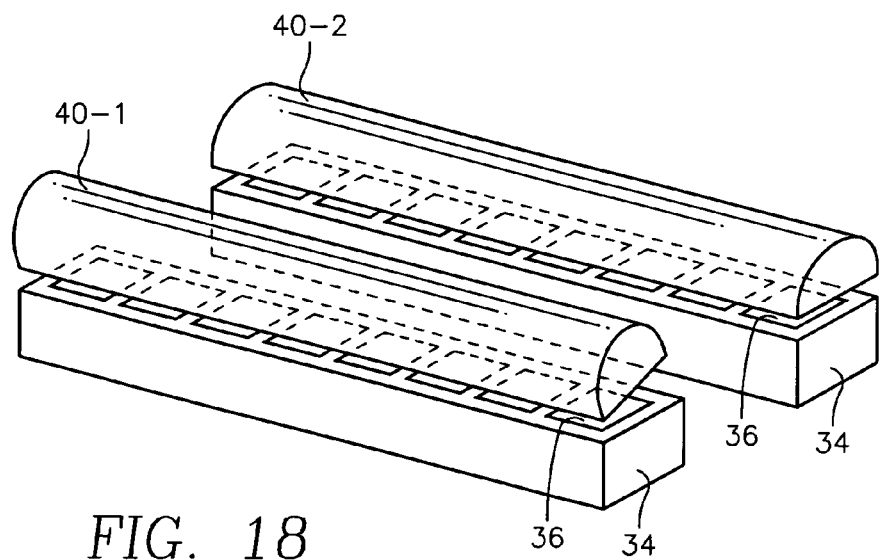

FIGS. 17 and 18 depict a modification of the embodiment of FIGS. 7 and 8, in which the prisms 44 are eliminated and, instead, different (i.e., alternate) ones of the half-cylindrical lenses 40 are rotated through the angle A. Rotating the selected cylindrical lenses 40 produces the same beam deflection as did the prisms 44 of FIGS. 7 and 8. The half-cylindrical lenses 40 are mounted on the respective laser bars 34 and aligned to produce the desired beam direction and then bonded to the laser bars, preferably with UV curable epoxy. Thus, half the lenses (40-1, 40-3, 40-5) are aligned to provide a beam direction deflected by the angle A, while the remaining lenses 40-2, 40-4, 40-6 are aligned to provide an undeflected beam direction.

Figure 19:
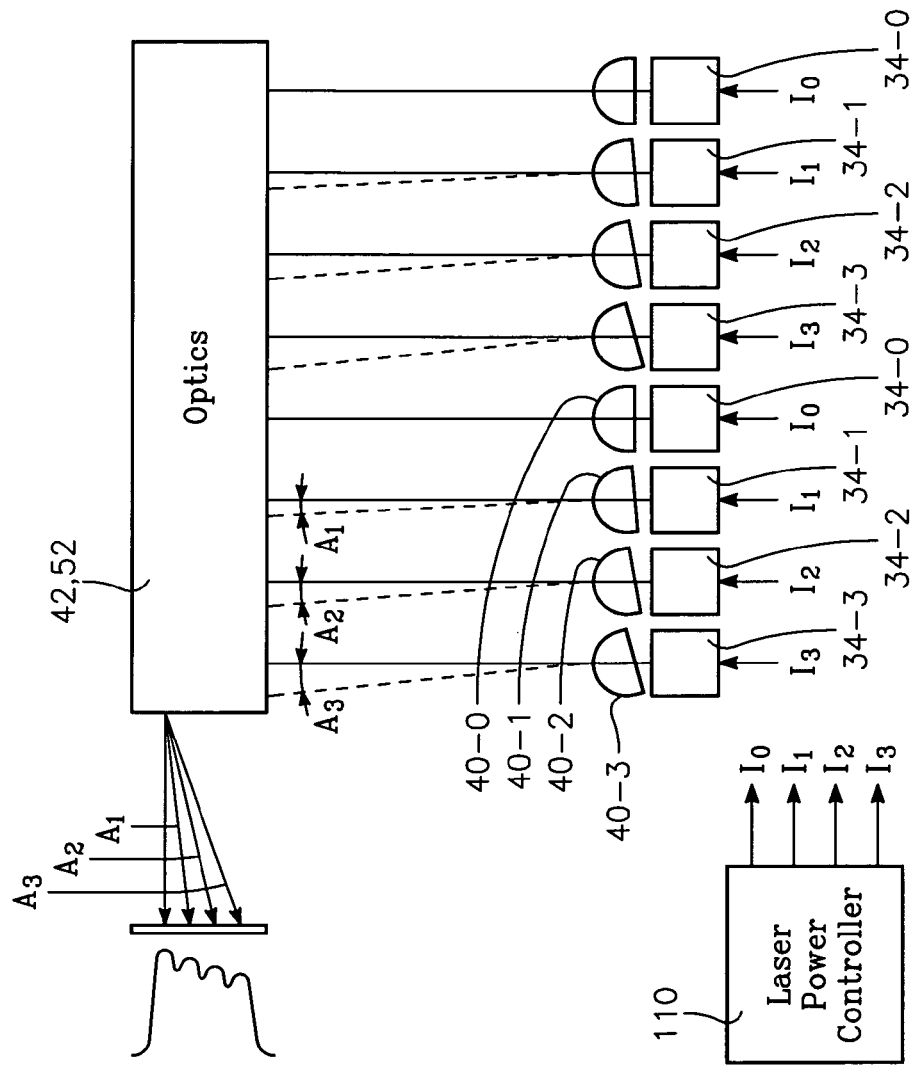
FIG. 19 is a schematic diagram depicting a first modification of the embodiment of FIG. 10 in which the prisms of successively greater beam deflection angles are replaced by rotating the corresponding fast-axis cylindrical lenses through successively greater angles.

FIG. 19 depicts a modification of the embodiment of FIG. 10 in which the prisms 44-1, 44-2, 44-3 of successively greater beam angles are eliminated and their beam deflection functions are provided instead by rotating corresponding ones of the half-cylindrical lenses (40-1, 40-2, 40-3) through successively greater angles A1, A2, A3. The lens 40-0 remains unrotated, to provide four successive beam angles of 0, A1, A2 and A3. This is identical to the succession of beam angles provided to the optics 42, 52, in the embodiment of FIG. 10.

Figure 20:
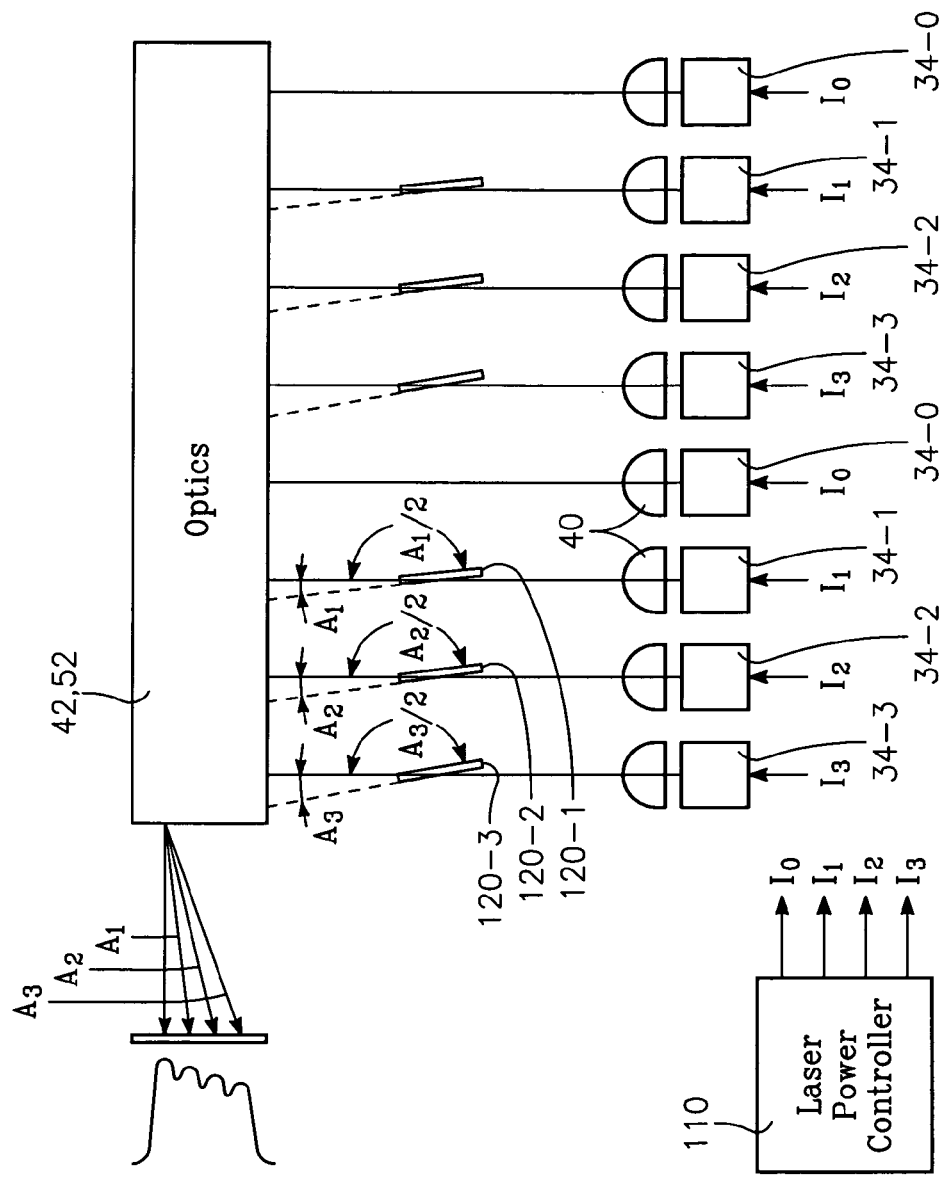
FIG. 20 is a schematic diagram depicting a second modification of the embodiment of FIG. 10 in which the prisms of successively greater beam deflection angles are replaced by respective beam deflecting mirrors rotated through successively greater angles.

FIG. 20 depicts a modification of the embodiment of FIG. 10 in which the prisms 44-1, 44-2, 44-3 of successively greater beam angles are replaced by mirrors 120-1, 120-2, 120-3 rotated by successively greater angles $A_1/2, A_2/2, A_3/2$ deflecting the beams from the laser bars 34-1, 34-2, 34-3, respectively. The beams from the laser bar 34-0 is undeflected, to provide four successive beam angles of 0, A1, A2 and A3. This is identical to the succession of beam angles provided to the optics 42, 52, in the embodiment of FIG. 10.

While the invention has been described in detail with reference to preferred embodiments, it is understood that variations and modifications thereof may be made without departing from the true spirit and scope of the invention.

What is claimed is:

1. A dynamic surface anneal apparatus for annealing a semiconductor workpiece, said apparatus comprising:
    a workpiece support for supporting a workpiece;
    an optical source;
    scanning apparatus for scanning said optical source and said workpiece support relative to one another along a fast axis;
    wherein said optical source comprises:
        an array of laser emitters arranged generally in successive rows of said emitters, said rows being transverse to said fast axis;
        plural collimating lenslets overlying respective ones of said rows of emitters and having a collimation direction along said fast axis;
        a fast axis optical deflection element associated with selected ones of said rows of emitters and having an optical deflection angle corresponding to a beam deflection along said fast axis for said selected rows of emitters; and
        optical apparatus for focusing light from said array of laser emitters into a narrow line beam on a surface of said workpiece along a direction transverse to said fast axis.

2. The apparatus of claim 1 wherein said optical apparatus produces a first line beam on the workpiece surface from light from said selected ones of said rows of emitters, and produces a second line beam on the workpiece surface from light from the remaining ones of said rows of emitters, said first and second line beams being mutually parallel and transverse to said fast axis and being offset from one another along said fast axis by a distance corresponding to said deflection angle.

3. The apparatus of claim 2 wherein one of said first and second line beams is a leading beam and the other is a trailing beam.

4. The apparatus of claim 1 further comprising:
    a fast axis beam profile controller;
    a first current source coupled to supply the rows of emitters not covered by said optical deflection elements; and
    a second current source coupled to supply the rows of emitters that are covered by said optical deflection elements.

5. The apparatus of claim 4 wherein said fast axis beam profile controller is programmed to adjust the output levels of said first and second current sources independently in accordance with a desired fast axis power density profile.

6. The apparatus of claim 5 wherein said first and second current sources set power densities of leading and trailing line beams, respectively, on the workpiece surface.

7. The apparatus of claim 2 wherein the width of each line beam along said fast axis corresponds to a minimum resolvable image size.

8. The apparatus of claim 7 wherein said deflection angle is such that the distance by which said first and second line beams are offset along said fast axis corresponds to a minimum resolvable image size.

9. The apparatus of claim 8 wherein said distance of the offset by a half-maximum Gaussian width along said fast axis of one of said line beams.

10. The apparatus of claim 1 wherein said fast axis optical deflection element comprises a beam deflection mirror in the optical path of a group of successive ones of said rows of emitters.

11. The apparatus of claim 1 wherein said fast axis optical deflection element comprises:
   plural optical deflection elements overlying said selected ones of said rows of emitters, each having an angle of deflection providing a beam deflection along said fast axis.

12. The apparatus of claim 11 wherein each of said plural optical deflection elements is a prism overlying the collimating lens of a corresponding row of said emitters.

13. The apparatus of claim 11 wherein each of said plural optical deflection elements is a mirror in the optical path of a corresponding row of said emitters.

14. The apparatus of claim 11 wherein each of said plural optical deflection elements is a corresponding one of said collimating lenslets that is rotated through a corresponding beam deflection angle.

15. The apparatus of claim 1 wherein said fast axis optical deflection element comprises:
   plural optical deflection elements overlying said selected ones of said rows of emitters, each having one of a succession of angles of deflection corresponding to a succession of beam deflections along said fast axis.

16. The apparatus of claim 15 wherein said plural optical deflection elements are a plurality of prisms overlying the collimating lenses of corresponding rows of said emitters, successive ones of said prisms have a succession of beam deflection angles.

17. The apparatus of claim 15 wherein said plural optical deflection elements are a plurality of mirrors in the optical path of corresponding rows of said emitters, successive ones of said mirrors oriented at successive angles to provide a succession of beam deflection angles.

18. The apparatus of claim 15 wherein each of said plural optical deflection elements is a corresponding one of said collimating lenses that is rotated through a corresponding one of a succession of beam deflection angles.

19. The apparatus of claim 15 wherein said optical apparatus produces a succession of line beams on the workpiece surface from light from different ones or groups of said rows of emitters corresponding to said succession of angles of deflection of said optical deflection elements, adjacent ones of said line beams being mutually parallel and transverse to said fast axis and being offset from one another along said fast axis by a distance corresponding to a difference between successive ones of said deflection angles.

20. The apparatus of claim 15 further comprising a fast axis beam profile controller and a plurality of independently adjustable current sources coupled to supply the rows of emitters associated with corresponding ones of said plurality of beam deflection elements.

21. The apparatus of claim 20 wherein said fast axis beam profile controller is programmed to adjust the output levels of said plural current sources independently in accordance with a desired fast axis power density profile.

22. The apparatus of claim 19 wherein said successive ones of said deflection angles provides a beam-to-beam displacement along the fast axis corresponding to a minimum resolvable spot size.

23. The apparatus of claim 19 wherein said successive ones of said deflection angles provide a beam-to-beam displacement along the fast axis corresponding to a half-maximum Gaussian width of one of said beams along the fast axis.

24. The apparatus of claim 1 wherein said fast axis optical deflection element comprises a beam deflection prism in the optical path of a group of successive ones of said rows of emitters.

* * * * *